(12) United States Patent
Zhang et al.

(10) Patent No.: US 12,255,658 B2
(45) Date of Patent: Mar. 18, 2025

(54) SUB-SAMPLING PHASE-LOCKED LOOP CIRCUIT CAPABLE OF AVOIDING HARMONIC LOCKING

(71) Applicant: MAGNICHIP CO., LTD, Nanjing (CN)

(72) Inventors: Hao Zhang, Nanjing (CN); Chao Zhao, Nanjing (CN)

(73) Assignee: MAGNICHIP CO., LTD, Nanjing (CN)

( * ) Notice: Subject to any disclaimer, the term of this patent is extended or adjusted under 35 U.S.C. 154(b) by 0 days.

(21) Appl. No.: 18/822,563

(22) Filed: Sep. 3, 2024

(65) Prior Publication Data

US 2025/0023572 A1    Jan. 16, 2025

Related U.S. Application Data

(63) Continuation of application No. PCT/CN2023/128412, filed on Oct. 31, 2023.

(51) Int. Cl.
*H03L 7/089* (2006.01)
*H02M 3/07* (2006.01)
*H03L 7/099* (2006.01)

(52) U.S. Cl.
CPC ............ *H03L 7/0895* (2013.01); *H02M 3/07* (2013.01); *H03L 7/099* (2013.01)

(58) Field of Classification Search
CPC ..... H03L 7/0895; H03L 7/099; H03L 7/0891; H03L 7/0896; H03L 7/085; H03L 7/095; H03L 7/091; H03L 7/08; H02M 3/07
See application file for complete search history.

(56) References Cited

U.S. PATENT DOCUMENTS

| | | | |
|---|---|---|---|
| 2001/0052806 A1 | 12/2001 | Gu et al. | |
| 2008/0291770 A1 | 11/2008 | Ishikawa | |
| 2011/0156829 A1* | 6/2011 | Wang | H03L 7/0802 |
| | | | 331/117 FE |

FOREIGN PATENT DOCUMENTS

| | | |
|---|---|---|
| CN | 110233621 A | 9/2019 |
| JP | 2002207527 A | 7/2002 |
| JP | 2006041810 A | 2/2006 |

* cited by examiner

*Primary Examiner* — Jung Kim
(74) *Attorney, Agent, or Firm* — CBM PATENT CONSULTING, LLC

(57) ABSTRACT

Disclosed is a sub-sampling phase-locked loop circuit capable of avoiding harmonic locking, which comprises a harmonic suppression sampling charge pump module, a filter module and a voltage-controlled oscillator module; a reference clock signal and differential signals are respectively accessed to an input end of the harmonic suppression sampling charge pump module, an output signal of an output end of the harmonic suppression sampling charge pump module is accessed to a filter and then accessed to an input of a voltage-controlled oscillator, an output end of the voltage-controlled oscillator module outputs differential signals as the differential signals accessed to the input end of the harmonic suppression sampling charge pump module, output signals of the voltage-controlled oscillator module are used as final outputs of the phase-locked loop circuit, and the output differential signals are synchronous with the reference clock in phase at the same time.

3 Claims, 2 Drawing Sheets

SUB-SAMPLING PHASE-LOCKED LOOP CIRCUIT CAPABLE OF AVOIDING HARMONIC LOCKING

CROSS-REFERENCE TO RELATED APPLICATIONS

This application is the U.S. continuation application of International Application No. PCT/CN2023/128412 filed on 31 Oct. 2023 which designated the U.S. and claims priority to Chinese Application No. CN202310739245.5 filed on 21 Jun. 2023, the entire contents of each of which are hereby incorporated by reference.

TECHNICAL FIELD

The present invention relates to the field of semiconductor integrated circuits, and particularly to a sub-sampling phase-locked loop circuit capable of avoiding harmonic locking.

BACKGROUND

With the continuous development of 5G and 6G communication technology and phased array radar, higher requirements are put forward for a clock system, especially the requirement for ultra-low jitter and array clock synchronization, which is a hot spot in the industry. The small increase of cost and power consumption of single clock synchronization will be amplified by hundreds or even thousands of times in the face of large-scale clock array synchronization. In the prior art, in order to reduce the in-band noise and power consumption, the document "Xiang G, Klumperink E, Bohsali M, et al. A 2.2 GHz 7.6 mW sub-sampling PLL with −126 dBc/Hz in-band phase noise and 0.15 psrms jitter in 0.18 μm CMOS[C]//IEEE International Solid-state Circuits Conference. IEEE, 2009." put forward a sub-sampling phase-locked loop circuit architecture, which was evolved into an all-digital architecture and a digital-analog fusion architecture after more than ten years of development; and in the document "Wu W, Yao C W, Guo C, et al. A 14-nm Ultra-Low Jitter Fractional-N PLL Using a DTC Range Reduction Technique and a Reconfigurable Dual-Core VCO [J]. IEEE Journal of Solid-State Circuits, 2021 (56-12).", an ultra-low noise clock system based on a sub-sampling phase-locked loop technology was realized at 14 nm based on DTC. However, a sub-sampling phase-locked loop is extremely easy to be locked on a harmonic frequency of a voltage-controlled oscillator under an influence of structure, so as to lead to a wrong output, so that a traditional structure often needs to be added with an additional frequency-locked loop to solve this problem. In both of the documents above, an additional phase-frequency detector PFD and an additional charge pump CP are used to assist locking, such structure obviously not only increases a circuit area, but also needs to switch between two paths of sub-sampling and the phase-frequency detector and the charge pump, and meanwhile, it is necessary to pay special attention to the stability of the loop. In addition, an auxiliary frequency-locked loop based on a counter can solve the problem of harmonic locking of sub-sampling. However, in a process of locking, unlocking and locking of the system, the switching between a digital loop and an analog loop will lead to very long relock time, so that a high-frequency counter also increases the power consumption.

The large-scale clock array synchronization not only puts forward a higher requirement for noise of a single clock generation circuit, but also limits the power consumption and cost of the single clock circuit, and the small increase of power consumption of the single clock circuit will be amplified by hundreds of times by a large-scale array, so as to cause the heating of the system, leading to the failure of a chip.

Thus, it can be seen that, in the face of a large-scale clock synchronization array, an existing sub-sampling phase-locked loop needs the additional high-frequency counter or the additional phase-frequency detector and the additional charge pump to avoid harmonic locking, which not only causes an additional area and an additional power consumption waste, but also increases the complexity of the circuit. Therefore, how to solve the problem of large-scale clock array synchronization with low cost and power consumption is an urgent technical problem to be solved by those skilled in the art.

SUMMARY

The present invention designs a sub-sampling phase-locked loop circuit capable of avoiding harmonic locking, which solves the problem that an existing sub-sampling phase-locked loop needs an additional high-frequency counter or an additional phase-frequency detector and an additional charge pump to avoid harmonic locking, which not only causes an additional area and an additional power consumption waste, but also increases the complexity of the circuit.

In order to solve the technical problem above, the present invention adopts the following technical solution: a sub-sampling phase-locked loop circuit capable of avoiding harmonic locking comprises a harmonic suppression sampling charge pump module, a filter module and a voltage-controlled oscillator module, wherein an input end of the harmonic suppression sampling charge pump module is used as an input end of a sub-sampling phase-locked loop circuit, a reference clock signal FREF and differential signals VCOP and VCON are respectively accessed to an input end of the harmonic suppression sampling charge pump module, an output signal Iout of an output end of the harmonic suppression sampling charge pump module is accessed to an input end of the filter module, an output end of the filter module is connected with an input end of the voltage-controlled oscillator module, an output end of the voltage-controlled oscillator module outputs differential signals as the differential signals VCOP and VCON accessed to the input end of the harmonic suppression sampling charge pump module, output signals VCOP and VCON of the voltage-controlled oscillator module are used as final outputs of the sub-sampling phase-locked loop circuit, and the differential signals VCOP and VCON are synchronous with the reference clock signal FREF in phase at the same time.

As a preferred technical solution of the present invention, the harmonic suppression sampling charge pump module comprises a sub-sampling phase comparison unit, a switched capacitor frequency comparison unit and a charge pump unit; the reference clock signal FREF and the differential signals VCOP and VCON are respectively accessed to the sub-sampling phase comparison unit, and an output end of the sub-sampling phase comparison unit outputs signals VSAMP and VSAMN respectively; the reference clock signal FREF and the differential signal VCOP are respectively accessed to the switched capacitor frequency comparison unit, and an output end of the switched capacitor frequency comparison unit outputs signals FCMN and FCMP respectively; and the signals VSAMP and VSAMN and the signals FCMN and FCMP are respectively accessed to the charge pump unit, and an output end of the charge pump unit outputs the signal Iout.

As a preferred technical solution of the present invention, the sub-sampling phase comparison unit comprises a switch S1, a switch S2, a capacitor C1 and a capacitor C2; and one end of the switch S1 is accessed with the differential signal VCOP output by the voltage controlled oscillator module, one end of the switch S2 is accessed with the differential signal VCON output by the voltage-controlled oscillator module, the other end of the switch S1 is used as a first output end of the sub-sampling phase comparison unit to output the signal VSAMP, the other end of the switch S2 is used as a second output end of the sub-sampling phase comparison unit to output the signal VSAMN, the switches S1 and S2 are both controlled to be turned on and off based on the reference clock signal FREF, one end of the capacitor C1 is connected with the other end of the switch S1, one end of the capacitor C2 is connected with the other end of the switch S2, and the other ends of the capacitors C1 and C2 are grounded.

As a preferred technical solution of the present invention, the switched capacitor frequency comparison unit comprises a transistor M17, a transistor M18, a switch S3, a switch S4, a switch S5, a switch S6, a capacitor C3, a capacitor C4, a non-overlapping clock generation circuit N1 and a non-overlapping clock generation circuit N2; and sources of the transistor M17 and the transistor M18 are both connected with a power supply VDD, gates of the transistor M17 and the transistor M18 are both connected with a bias voltage VBP, a drain of the transistor M17 is connected with one end of the switch S3, a drain of the transistor M18 is connected with one end of the switch S5, one end of the switch S4 is connected with one end of the capacitor C3, the other end of the switch S4 is connected with the other end of the switch S3, one end of the switch S6 is connected with one end of the capacitor C4, the other end of the switch S6 is connected with the other end of the switch S5, the other ends of the capacitor C3 and the capacitor C4 are both grounded, the switches S3 and S4 are controlled to be turned on and off by the non-overlapping clock generation circuit N2, the switches S5 and S6 are controlled to be turned on and off by the non-overlapping clock generation circuit N1, an input of the non-overlapping clock generation circuit N2 is the reference clock signal FREF, an input of the non-overlapping clock generation circuit N1 is the differential signal VCOP, and the drain of the transistor M17 is used as a first output end of the switched capacitor frequency comparison unit to output the signal FCMN and the drain of the transistor M18 is used as a second output end of the switched capacitor frequency comparison unit to output the signal FCMP.

As a preferred technical solution of the present invention, the charge pump unit comprises a transistor M0, a transistor M1, a transistor M2, a transistor M3, a transistor M4, a transistor M5, a transistor M6, a transistor M7, a transistor M8, a transistor M9, a transistor M10, a transistor M11, a transistor M12, a transistor M13, a transistor M14, a transistor M15, a transistor M16, a switch S7, a switch S8, a switch S9 and a switch S10, a gate of the transistor M0 is connected with the bias voltage VBP, a drain of the transistor M0 is connected with a source of the transistor M1, a source of the transistor M2, a source of the transistor M3 and a source of the transistor M4 respectively, a gate of the transistor M1 is accessed with the signal VSAMP, a gate of the transistor M2 is accessed with the signal FCMP, drains of the transistor M1 and the transistor M2 are connected and then connected with a drain of the transistor M5 and a gate of the transistor M6 respectively, a gate of the transistor M5 is connected with the bias voltage VBN, and a source of the transistor M5 is connected with a drain of the transistor M6; a gate of the transistor M3 is accessed with the signal FCMN, a gate of the transistor M4 is accessed with the signal VSAMN, drains of the transistor M3 and the transistor M4 are connected and then connected with a drain of the transistor M7 and a gate of the transistor M8 respectively, a gate of the transistor M7 is connected with the bias voltage VBN, and a source of the transistor M7 is connected with a drain of the transistor M8; a gate of the transistor M10 is connected with the gate of the transistor M8, a drain of the transistor M10 is connected with a source of the transistor M9, a gate of the transistor M9 is connected with the bias voltage VBN, a drain of the transistor M9 is connected with a gate of the transistor M11, a drain of transistor M12 and a gate of transistor M13 respectively, and a source of the transistor M12 is connected with a drain of the transistor M11; and a drain of the transistor M13 is connected with a source of the transistor M14, a drain of the transistor M14 is connected with one end of the switch S7 and one end of the switch S9 respectively, a gate of the transistor M14 is connected with a gate of the transistor M12, the other end of the switch S7 is connected with one end of the switch S8, the other end of the switch S9 is connected with one end of the switch S10, a drain of the transistor M15 is connected with the other end of the switch S8 and the other end of the switch S10 respectively, a gate of the transistor M15 is connected with the bias voltage VBN, a source of the transistor M15 is connected with a drain of the transistor M16, a gate of the transistor M16 is connected with the gate of the transistor M6, and a source of the transistor M0, a source of the transistor M11 and a source of the transistor M13 are connected with the power supply VDD; a source of the transistor M6, a source of the transistor M8, a source of the transistor M10 and a source of the transistor M16 are grounded; the switch S7 and the switch S10 are controlled to be turned on and off by a signal PUL, the switch S9 and the switch S8 are controlled to be turned on and off by a signal PULB, and the signals PUL and PULB are generated by the reference clock signal FREF through a pulse generator module; and one end of the switch S10 is used as an output end of the charge pump unit to output the signal Iout.

The present invention has the beneficial effects that: the present invention provides the sub-sampling phase-locked loop circuit capable of avoiding harmonic locking, which comprises the harmonic suppression sampling charge pump module, the filter module and the voltage-controlled oscillator module. According to the present invention, an additional high-frequency counter, an additional auxiliary phase-frequency detector and an additional auxiliary charge pump are not needed, the problem of harmonic locking of a traditional sub-sampling phase-locked loop can be solved only through a small number of switches and capacitors, and an area and a power consumption are effectively reduced while reducing in-band noise, thus having the characteristics of simplicity and reliability. According to the present invention, a harmonic suppression function is directly embedded into the sampling charge pump, which avoids switching back and forth between frequency locking and phase locking, simplifies the complexity of switching back and forth between the phase-locked loop and the harmonic suppression loop, and reduces the dynamic parameter variation and complexity of the loop; and moreover, the structure can be realized at a small cost with only the switches and the capacitors, thus being easy to transplant and integrate, and improving the efficiency of product technology transplantation and development.

DETAILED DESCRIPTION

The present invention is further described hereinafter with reference to the drawings. The following embodiments may help those skilled in the art to understand the present invention more comprehensively, but the embodiments are not intended to limit the present invention in any way.

Figure 1:
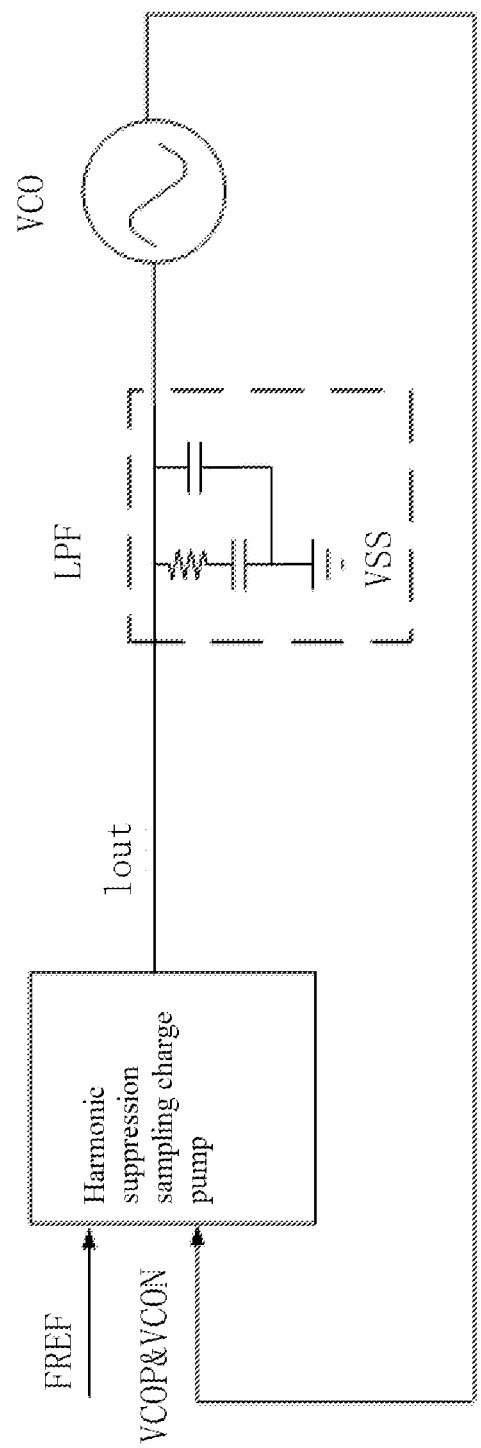
FIG. 1 is a structural diagram of a sub-sampling phase-locked loop circuit capable of avoiding harmonic locking in an embodiment of the present invention.

In order to solve the technical problem above, the present invention adopts the following technical solution: a sub-sampling phase-locked loop circuit capable of avoiding harmonic locking, as shown in FIG. 1, comprises a harmonic suppression sampling charge pump module, a filter module (LPF) and a voltage-controlled oscillator module (VCO), which jointly constitute the sub-sampling phase-locked loop circuit, wherein an input end of the harmonic suppression sampling charge pump module is used as an input end of a sub-sampling phase-locked loop circuit, based on an external reference clock signal FREF of the phase-locked loop circuit, the reference clock signal FREF and differential signals VCOP and VCON are respectively accessed to an input end of the harmonic suppression sampling charge pump module, an output signal Iout of an output end of the harmonic suppression sampling charge pump module is accessed to an input end of the filter module, an output end of the filter module is connected with an input end of the voltage-controlled oscillator module, an output end of the voltage-controlled oscillator module outputs differential signals as the differential signals VCOP and VCON accessed to the input end of the harmonic suppression sampling charge pump module, that is, the differential signals VCOP and VCON accessed to the harmonic suppression sampling charge pump module are updated, output signals VCOP and VCON of the voltage-controlled oscillator module are used as final outputs of the sub-sampling phase-locked loop circuit, and the differential signals VCOP and VCON are synchronous with the reference clock signal FREF in phase at the same time.

Figure 2:
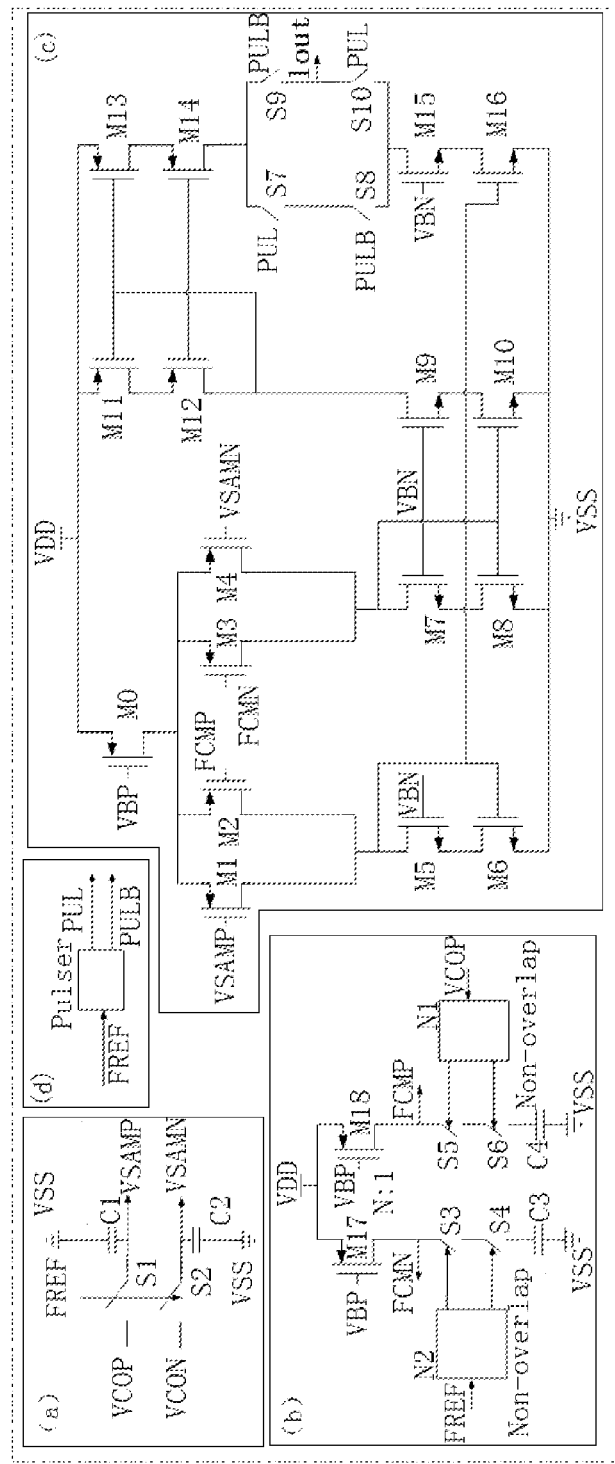
FIG. 2 is a structural diagram of a harmonic suppression sampling charge pump module in the embodiment of the present invention.

As shown in FIG. 2, the harmonic suppression sampling charge pump module comprises a sub-sampling phase comparison unit, a switched capacitor frequency comparison unit and a charge pump unit; the reference clock signal FREF and the differential signals VCOP and VCON are respectively accessed to the sub-sampling phase comparison unit, and an output end of the sub-sampling phase comparison unit outputs signals VSAMP and VSAMN respectively; the reference clock signal FREF and the differential signal VCOP are respectively accessed to the switched capacitor frequency comparison unit, and an output end of the switched capacitor frequency comparison unit outputs signals FCMN and FCMP respectively; and the signals VSAMP and VSAMN and the signals FCMN and FCMP are respectively accessed to the charge pump unit, and an output end of the charge pump unit outputs the signal Iout.

As shown in the section (a) of FIG. 2, the sub-sampling phase comparison unit comprises a switch S1, a switch S2, a capacitor C1 and a capacitor C2; and one end of the switch S1 is accessed with the differential signal VCOP output by the voltage controlled oscillator module, one end of the switch S2 is accessed with the differential signal VCON output by the voltage-controlled oscillator module, the other end of the switch S1 is used as a first output end of the sub-sampling phase comparison unit to output the signal VSAMP, the other end of the switch S2 is used as a second output end of the sub-sampling phase comparison unit to output the signal VSAMN, the switches S1 and S2 are both controlled to be turned on and off based on the reference clock signal FREF, one end of the capacitor C1 is connected with the other end of the switch S1, one end of the capacitor C2 is connected with the other end of the switch S2, and the other ends of the capacitors C1 and C2 are grounded.

As shown in the section (b) of FIG. 2, the switched capacitor frequency comparison unit comprises a transistor M17, a transistor M18, a switch S3, a switch S4, a switch S5, a switch S6, a capacitor C3, a capacitor C4, a non-overlapping clock generation circuit N1 and a non-overlapping clock generation circuit N2; and sources of the transistor M17 and the transistor M18 are both connected with a power supply VDD, gates of the transistor M17 and the transistor M18 are both connected with a bias voltage VBP, a drain of the transistor M17 is connected with one end of the switch S3, a drain of the transistor M18 is connected with one end of the switch S5, an N:1 current mirror is composed of the transistor M17 and the transistor M18, one end of the switch S4 is connected with one end of the capacitor C3, the other end of the switch S4 is connected with the other end of the switch S3, one end of the switch S6 is connected with one end of the capacitor C4, the other end of the switch S6 is connected with the other end of the switch S5, the other ends of the capacitor C3 and the capacitor C4 are both grounded, the switches S3 to S6 are controlled by a non-overlapping clock generation circuit Non-Overlap, the switches S3 to S6 are controlled by a two-phase non-overlapping clock generation circuit in the embodiment, the switches S3 and S4 are controlled to be turned on and off by the non-overlapping clock generation circuit N2, the switches S5 and S6 are controlled to be turned on and off by the non-overlapping clock generation circuit N1, an input of the two-phase non-overlapping clock generation circuit N2 is the reference clock signal FREF, an input of the two-phase non-overlapping clock generation circuit N1 is the differential signal VCOP, the drains of the transistor M17 and the transistor M18 are used as output ends of the switched capacitor frequency comparison unit to output the signals FCMN and FCMP respectively, and the drain of the transistor M17 is used as a first output end of the switched capacitor frequency comparison unit to output the signal FCMN and the drain of the transistor M18 is used as a second output end of the switched capacitor frequency comparison unit to output the signal FCMP.

As shown in the section (c) of FIG. 2, the charge pump unit comprises a transistor M0, a transistor M1, a transistor M2, a transistor M3, a transistor M4, a transistor M5, a transistor M6, a transistor M7, a transistor M8, a transistor M9, a transistor M10, a transistor M11, a transistor M12, a transistor M13, a transistor M14, a transistor M15, a transistor M16, a switch S7, a switch S8, a switch S9 and a switch S10, a gate of the transistor M0 is connected with the bias voltage VBP, a drain of the transistor M0 is connected with a source of the transistor M1, a source of the transistor M2, a source of the transistor M3 and a source of the transistor M4 respectively, a gate of the transistor M1 is accessed with the signal VSAMP, a gate of the transistor M2 is accessed with the signal FCMP, drains of the transistor M1 and the transistor M2 are connected and then connected with a drain of the transistor M5 and a gate of the transistor M6 respectively, a gate of the transistor M5 is connected with the bias voltage VBN, and a source of the transistor M5 is connected with a drain of the transistor M6; a gate of the transistor M3 is accessed with the signal FCMN, a gate of the transistor M4 is accessed with the signal VSAMN, drains of the transistor M3 and the transistor M4 are connected and then connected with a drain of the transistor M7 and a gate of the transistor M8 respectively, a gate of the transistor M7 is connected with the bias voltage VBN, and a source of the transistor M7 is connected with a drain of the transistor M8; a gate of the transistor M10 is connected with the gate of the transistor M8, a drain of the transistor M10 is connected with a source of the transistor M9, a gate of the transistor M9 is connected with the bias voltage VBN, a drain of the transistor M9 is connected with a gate of the transistor M11, a drain of transistor M12 and a gate of transistor M13 respectively, and a source of the transistor M12 is connected with a drain of the transistor M11; and a drain of the transistor M13 is connected with a source of the transistor M14, a drain of the transistor M14 is connected with one end of the switch S7 and one end of the switch S9 respectively, a gate of the transistor M14 is connected with a gate of the transistor M12, the other end of the switch S7 is connected with one end of the switch S8, the other end of the switch S9 is connected with one end of the switch S10, a drain of the transistor M15 is connected with the other end of the switch S8 and the other end of the switch S10 respectively, a gate of the transistor M15 is connected with the bias voltage VBN, a source of the transistor M15 is connected with a drain of the transistor M16, a gate of the transistor M16 is connected with the gate of the transistor M6, and a source of the transistor M0, a source of the transistor M11 and a source of the transistor M13 are connected with the power supply VDD; a source of the transistor M6, a source of the transistor M8, a source of the transistor M10 and a source of the transistor M16 are grounded; the switch S7 and the switch S10 are controlled to be turned on and off by a signal PUL, the switch S9 and the switch S8 are controlled to be turned on and off by a signal PULB, and the signals PUL and PULB are generated by the reference clock signal FREF through a pulse generator module, that is, the module Pulser in the figure, and the module Pulser inputs and then outputs two complementary pulse signals based on the reference clock signal FREF; and as shown in FIG. 2(d), one end of the switch S10 is used as an output end of the charge pump unit to output the signal Iout.

In the charge pump unit in this embodiment, the gate of the transistor M0 is connected with the bias voltage VBP to constitute a current source, the transistors M1 to M4 constitute two groups of differential input pairs, the transistors M5 and M6 constitute a CASCODE current mirror, the transistors M7 and M8 constitute a CASCODE current mirror, the transistors M9 and M10 constitute a CASCODE current mirror, the transistors M11 and M12 constitute a CASCODE current mirror, the transistors M13 and M14 constitute a CASCODE current mirror, and the transistors M15 and M16 constitute a CASCODE current mirror. In this embodiment, the bias voltages VBP and VBN are provided by a bias circuit, the bias circuit may adopt a conventional structure. The transistors in this embodiment are NMOS transistors.

The working principle of the sub-sampling phase-locked loop circuit capable of avoiding harmonic locking is as follows: although the traditional sub-sampling phase-locked loop clock circuit can effectively reduce in-band noise by using the sampling principle, periodic signals cannot be distinguished in a sampling process, so that the loop will be locked at a harmonic frequency, which has become one of the bottlenecks limiting the development of such structure. Although there have been various methods to deal with the problem of harmonic locking, it is found from careful research that, in order to solve the problem of harmonic locking, additional auxiliary phase-frequency detector and auxiliary charge pump circuits are needed, and the additional charge pump circuit not only increases an area and a power consumption of a whole chip, but also improves the complexity of the loop. In addition, an additional frequency-locked loop auxiliary circuit based on a counter can also solve the problem of harmonic locking, but there is the problem of excessively long locking time caused by switching back and forth between a digital loop and an analog loop.

The sub-sampling phase-locked loop circuit provided by the present invention can effectively solve the above problems. The impedance of the switch S3, the switch S4, the capacitor C3 and the non-overlapping generation circuit is shown in Formula 1: Formula 1: R=1/C/(Fclk), wherein C refers to the capacitor C3 and Folk refers to the reference clock signal FREF.

According to the above formula, the impedance is inversely proportional to the capacitance and the clock frequency. Frequency information may be converted into voltage information by injecting a current into the equivalent resistance, and frequency information of the reference clock and frequency information of the voltage-controlled oscillator may be converted into a voltage difference (FCMP-FCMN) by injecting a current source with a current ratio of 1:N into a switched capacitor controlled by the reference clock and a switched capacitor controlled by the voltage-controlled oscillator, with a structure as shown in the circuit in FIG. 2. The frequency difference, that is, the voltage difference, is directly used to control the output of the Iout of the charge pump, which can solve the problem of harmonic locking of the overall loop caused by the incapability of distinguishing harmonics of the traditional sampling charge pump. The switches S1 and S2 are controlled by the reference clock signal FREF, the differential signal output by the voltage-controlled oscillator is directly sampled, the phase difference information is converted into the voltage difference (VSAMP−VSAMN), and the voltage difference is also used to control the output of the Iout of the sampling charge pump. At this point, the charge pump has the function of phase-frequency detection, and the phase-locked loop clock circuit composed of the harmonic suppression sampling charge pump can effectively solve the problem of harmonic locking of the traditional sub-sampling phase-locked loop.

The present invention designs the sub-sampling phase-locked loop circuit capable of avoiding harmonic locking, and the overall structure comprises the harmonic suppression sampling charge pump module, the filter module and the voltage-controlled oscillator module. In the face of a large-scale clock synchronization array, especially in high-frequency applications such as radio frequency direct sampling, a small power consumption of a single clock circuit will be amplified by the array by a hundred times, and an excessive power consumption will lead to equipment heating, thus causing the failure of the chip. The present invention provides the novel sub-sampling phase-locked loop circuit, which reduces the in-band noise, without needing the additional counter-type frequency-locked loop or the additional phase-frequency detector and the additional charge pump to assist in frequency locking, and solves the problem of sub-sampling harmonic locking only through a small number of switches, thus greatly reducing the area and the power consumption of the clock circuit; according to the circuit, the harmonic suppression function is directly embedded into the sampling charge pump, which avoids switching back and forth between frequency locking and phase locking, simplifies the complexity of switching back and forth between the phase-locked loop and the harmonic suppression loop, and reduces the dynamic parameter variation and complexity of the loop; and moreover, the structure can be realized at a small cost with only the switches and the capacitors, thus being easy to transplant and integrate, and improving the efficiency of product technology transplantation and development.

The above are only the preferred embodiments of the present invention, but the preferred embodiments are not intended to limit the scope of patent of the present invention. Although the present invention is described in detail with reference to the above embodiments, those skilled in the art may still modify the technical solutions recorded in the above specific embodiments, or make equivalent replacements to some of the technical features. Any equivalent structures made by using the contents of the specification and the drawings of the present invention, or directly or indirectly applied in other related technical fields are equally included in the scope of protection of the patent of the present invention.

What is claimed is:

1. A sub-sampling phase-locked loop circuit capable of avoiding harmonic locking, comprising a harmonic suppression sampling charge pump module, a filter module and a voltage-controlled oscillator module, wherein an input end of the harmonic suppression sampling charge pump module is used as an input end of a sub-sampling phase-locked loop circuit, a reference clock signal FREF and differential signals VCOP and VCON are respectively accessed to an input end of the harmonic suppression sampling charge pump module, an output end of the harmonic suppression sampling charge pump module outputs an output signal Iout and the signal is accessed to an input end of the filter module, an output end of the filter module is connected with an input end of the voltage-controlled oscillator module, an output end of the voltage-controlled oscillator module outputs differential signals as the differential signals VCOP and VCON accessed to the input end of the harmonic suppression sampling charge pump module, output signals VCOP and VCON of the voltage-controlled oscillator module are used as final outputs of the sub-sampling phase-locked loop circuit, and the differential signals VCOP and VCON are synchronous with the reference clock signal FREF in phase at the same time;

the harmonic suppression sampling charge pump module comprises a sub-sampling phase comparison unit, a switched capacitor frequency comparison unit and a charge pump unit; the reference clock signal FREF and the differential signals VCOP and VCON are respectively accessed to the sub-sampling phase comparison unit, and an output end of the sub-sampling phase comparison unit outputs signals VSAMP and VSAMN respectively; the reference clock signal FREF and the differential signal VCOP are respectively accessed to the switched capacitor frequency comparison unit, and an output end of the switched capacitor frequency comparison unit outputs signals FCMN and FCMP respectively; and the signals VSAMP and VSAMN and the signals FCMN and FCMP are respectively accessed to the charge pump unit, and an output end of the charge pump unit outputs the signal Iout;

the charge pump unit comprises a transistor M0, a transistor M1, a transistor M2, a transistor M3, a transistor M4, a transistor M5, a transistor M6, a transistor M7, a transistor M8, a transistor M9, a transistor M10, a transistor M11, a transistor M12, a transistor M13, a transistor M14, a transistor M15, a transistor M16, a switch S7, a switch S8, a switch S9 and a switch S10;

a gate of the transistor M0 is connected with a bias voltage VBP, a drain of the transistor M0 is connected with a source of the transistor M1, a source of the transistor M2, a source of the transistor M3 and a source of the transistor M4 respectively, a gate of the transistor M1 is accessed with the signal VSAMP, a gate of the transistor M2 is accessed with the signal FCMP, drains of the transistor M1 and the transistor M2 are connected and then connected with a drain of the transistor M5 and a gate of the transistor M6 respectively, a gate of the transistor M5 is connected with a bias voltage VBN, and a source of the transistor M5 is connected with a drain of the transistor M6;

a gate of the transistor M3 is accessed with the signal FCMN, a gate of the transistor M4 is accessed with the signal VSAMN, drains of the transistor M3 and the transistor M4 are connected and then connected with a drain of the transistor M7 and a gate of the transistor M8 respectively, a gate of the transistor M7 is connected with the bias voltage VBN, and a source of the transistor M7 is connected with a drain of the transistor M8;

a gate of the transistor M10 is connected with the gate of the transistor M8, a drain of the transistor M10 is connected with a source of the transistor M9, a gate of the transistor M9 is connected with the bias voltage VBN, a drain of the transistor M9 is connected with a gate of the transistor M11, a drain of transistor M12 and a gate of transistor M13 respectively, and a source of the transistor M12 is connected with a drain of the transistor M11; and a drain of the transistor M13 is connected with a source of the transistor M14, a drain of the transistor M14 is connected with one end of the switch S7 and one end of the switch S9 respectively, a gate of the transistor M14 is connected with a gate of the transistor M12, the other end of the switch S7 is connected with one end of the switch S8, the other end of the switch S9 is connected with one end of the switch S10, a drain of the transistor M15 is connected with the other end of the switch S8 and the other end of the switch S10 respectively, a gate of the transistor M15 is connected with the bias voltage VBN, a source of the transistor M15 is connected with a drain of the transistor M16, a gate of the transistor M16 is connected with the gate of the transistor M6, and a source of the transistor M0, a source of the transistor M11 and a source of the transistor M13 are connected with the power supply VDD; a source of the transistor M6, a source of the transistor M8, a source of the transistor M10 and a source of the transistor M16 are grounded; the switch S7 and the switch S10 are controlled to be turned on and off by a signal PUL, the switch S9 and the switch S8 are controlled to be turned on and off by a signal PULB, and the signals PUL and PULB are generated by the reference clock signal FREF through a pulse generator module; and one end of the switch S10 is used as an output end of the charge pump unit to output the signal Iout.

2. The sub-sampling phase-locked loop circuit capable of avoiding harmonic locking according to claim 1, wherein the sub-sampling phase comparison unit comprises a switch S1, a switch S2, a capacitor C1 and a capacitor C2; and one end of the switch S1 is accessed with the differential signal VCOP output by the voltage controlled oscillator module, one end of the switch S2 is accessed with the differential signal VCON output by the voltage-controlled oscillator module, the other end of the switch S1 is used as a first output end of the sub-sampling phase comparison unit to output the signal VSAMP, the other end of the switch S2 is used as a second output end of the sub-sampling phase comparison unit to output the signal VSAMN, the switches S1 and S2 are both controlled to be turned on and off based on the reference clock signal FREF, one end of the capacitor C1 is connected with the other end of the switch S1, one end of the capacitor C2 is connected with the other end of the switch S2, and the other ends of the capacitors C1 and C2 are grounded.

3. The sub-sampling phase-locked loop circuit capable of avoiding harmonic locking according to claim 2, wherein the switched capacitor frequency comparison unit comprises a transistor M17, a transistor M18, a switch S3, a switch S4, a switch S5, a switch S6, a capacitor C3, a capacitor C4, a non-overlapping clock generation circuit N1 and a non-overlapping clock generation circuit N2; and sources of the transistor M17 and the transistor M18 are both connected with a power supply VDD, gates of the transistor M17 and the transistor M18 are both connected with the bias voltage VBP, a drain of the transistor M17 is connected with one end of the switch S3, a drain of the transistor M18 is connected with one end of the switch S5, one end of the switch S4 is connected with one end of the capacitor C3, the other end of the switch S4 is connected with the other end of the switch S3, one end of the switch S6 is connected with one end of the capacitor C4, the other end of the switch S6 is connected with the other end of the switch S5, the other ends of the capacitor C3 and the capacitor C4 are both grounded, the switches S3 and S4 are controlled to be turned on and off by the non-overlapping clock generation circuit N2, the switches S5 and S6 are controlled to be turned on and off by the non-overlapping clock generation circuit N1, an input of the non-overlapping clock generation circuit N2 is the reference clock signal FREF, an input of the non-overlapping clock generation circuit N1 is the differential signal VCOP, and the drain of the transistor M17 is used as a first output end of the switched capacitor frequency comparison unit to output the signal FCMN and the drain of the transistor M18 is used as a second output end of the switched capacitor frequency comparison unit to output the signal FCMP.

* * * * *